United States Patent [19]

Woods et al.

[11] 4,143,189
[45] Mar. 6, 1979

[54] METHOD FOR APPLYING A PHOTO POLYMER TO SURFACES

[76] Inventors: Jack L. Woods; Craig P. Woods, both of 1517 Ninth St., Ogden, Utah 84404

[21] Appl. No.: 468,038

[22] Filed: May 8, 1974

[51] Int. Cl.$^2$ .................. B05D 3/02; B05D 1/28; G03C 5/00; G03C 1/94
[52] U.S. Cl. .................. 427/385 B; 427/429; 427/430 R; 15/104.93; 96/86 P; 96/35.1
[58] Field of Search ............ 117/34; 96/1 LY, 115 R, 96/34, 66, 86 P, 35.1; 427/429, 430 R, 385 B; 15/104.93

[56] References Cited

U.S. PATENT DOCUMENTS

| | | | |
|---|---|---|---|
| 3,231,379 | 1/1966 | Hoerner | 96/115 X |
| 3,343,956 | 9/1967 | Wright | 96/1 LY |
| 3,695,877 | 10/1972 | Taneda et al. | 96/115 X |
| 3,704,154 | 11/1972 | Tatsuta et al. | 117/34 |
| 3,705,808 | 12/1972 | Kasugai et al. | 117/34 |

*Primary Examiner*—Michael R. Lusignan
*Attorney, Agent, or Firm*—H. Ross Workman; J. Winslow Young

[57] ABSTRACT

A method for applying a liquid photo polymer to a surface such that the photo polymer is uniform and holiday-free, the method comprising obtaining a plastic sponge and impregnating the plastic sponge with a liquid photo polymer comprising a solvent which slowly reacts with the plastic from which the sponge is formed. Thereafter, the sponge is brushed and/or drawn across the surface to deposit the photo polymer thereon, the application of the photo polymer being accomplished before the solvent in the photo polymer substantially disintegrates the sponge.

3 Claims, 1 Drawing Figure

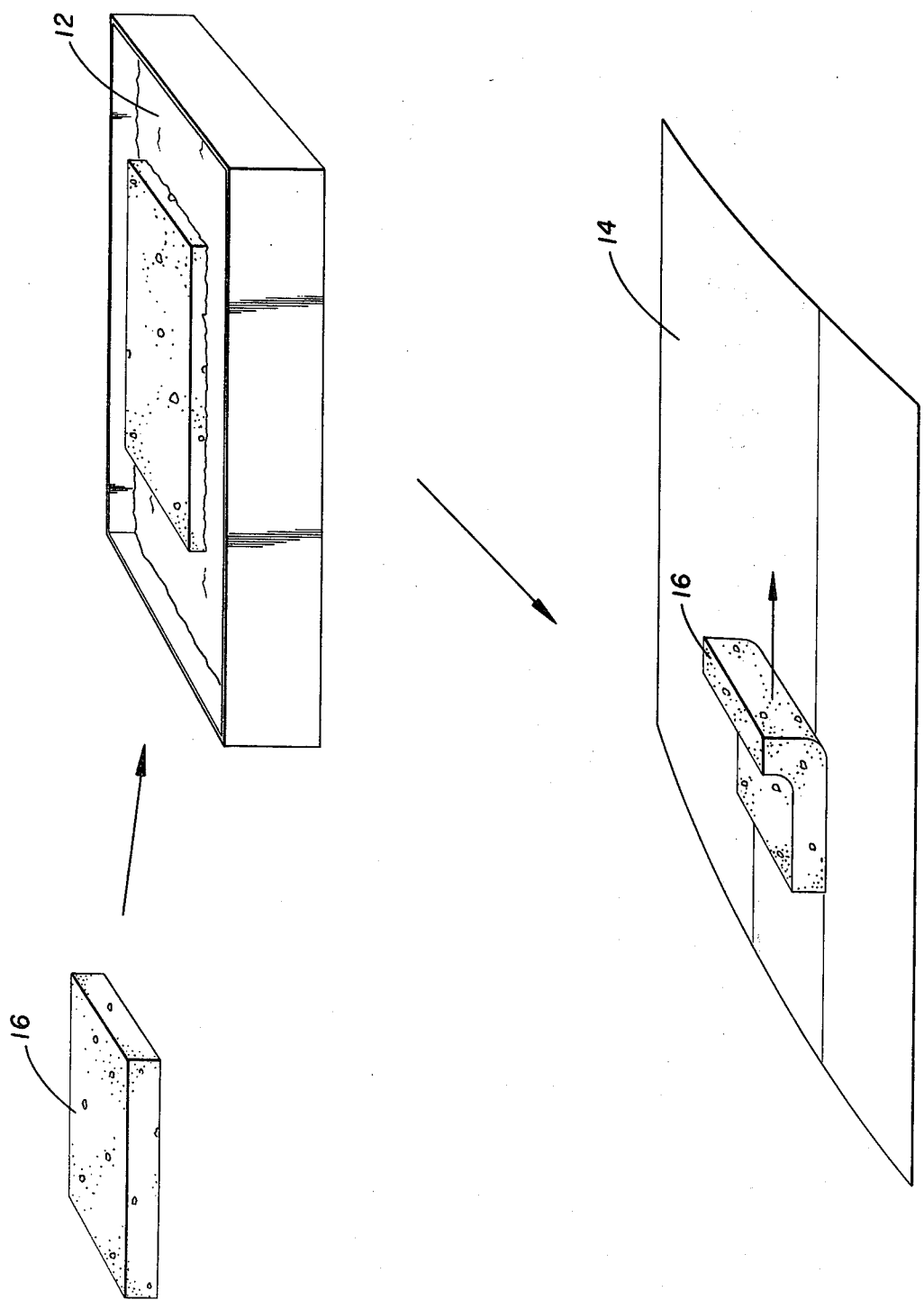

METHOD FOR APPLYING A PHOTO POLYMER TO SURFACES

BACKGROUND

1. Field of the Invention

The present invention relates to applying a photo polymer to a surface and more particularly to a novel method for applying a uniform, holiday-free photo polymer layer on surfaces of both smooth and/or irregular configuration.

2. The Prior Art

The use of photo polymers in the photo fabricating industry is extremely well-known for such valuable uses as production of printed circuits, photo etching, photoengraving and chemical milling and machining. These important processes have historically included a number of conventional steps:

A surface to be etched or milled is first coated with a light-sensitive photo polymer which, when cured, becomes resistant to acids, alkalies or both. Hence, the first photo polymer is commonly called a "resist". Conventionally, a mask is placed over the resist-coated surface so as to leave only selected portions of the resist exposed and unmasked. Depending upon the type of resist used, the light impinging upon the unmasked areas either hardens the resists or degrades the resist so that when the resist-coated part of the surface is subsequently washed in a developer, part of the resist is removed leaving an image defined by the mask on the surface.

The key in producing high quality work of this type is to apply liquid resists uniformly and free from dust, dirt and voids or pin holes, commonly referred to as holidays. The difficulty of properly applying liquid resist is well-known in the industry and numerous techniques have been tried. One somewhat effective prior art method includes completely immersing a surface in liquid resist and slowly removing the surface from the liquid to improve the uniformity of resist thickness. The dipping method has, however, proved to be extremely slow and cumbersome. This is particularly true where the surface is very large or where placement of resist on all parts of the surface is undesirable.

In the face of serious problems encountered in applying liquid resist, at least two major suppliers of resist have abandoned the liquid resist approach and have developed solid film resists which are laminated to the surface. While solid film resists are more expensive than liquid resist, they have gained a strong foothold in the industry because many feel that they can be more reliably applied than liquid resists.

It would therefore be a substantial contribution to the industry to provide a technique of applying liquid resist so as to be uniform and holiday-free.

BRIEF SUMMARY AND OBJECTS OF THE INVENTION

The invention defined herein provides for a uniform holiday-free application of liquid resist to regular and irregular surfaces by impregnating a plastic sponge material with a liquid resist comprising a solvent which tends to slowly react with the fabric of the sponge. The sponge thus impregnated has been found to uniquely apply a superior liquid resist coating upon the surface.

It is, therefore, a primary object of the present invention to provide an improved method for applying a liquid resist.

This and other objects and features of the present invention will become more fully apparent from the following description and appended claims taken in conjunction with the accompanying drawing.

BRIEF DESCRIPTION OF THE FIGURE

The FIGURE is a schematic flow diagram illustrating principal steps of a preferred embodiment of the invention.

DETAILED DECRIPTION OF THE PREFERRED EMBODIMENT

According to the presently preferred embodiment of the invention, a desired liquid photo polymer resist 12 is selected for application to a surface 14. Any suitably liquid photo resist polymer such as Eastman Kodak KPR, KMER, Dynachem GMR 5000 or the like may be used. All of the well-known photo polymer resists comprise a solvent which volatilizes in the atmosphere to cure the resist.

Next, an applicator 16 is selected. Preferably, the applicator 16 is fabricated from a cellular sponge material preferably made of synthetic plastic. The synthetic plastics are preferred because they are more easily affected by the common solvents in conventional resists. According to the present invention, it has been found surprisingly effective to use a sponge applicator 16 which slowly reacts with the solvent of the photo resist. Initially, the sponge material is impregnated with the photo resist whereupon the solvent in the resist is permitted to react at least with the exterior of the applicator. Care is taken, however, to insure that the applicator is not permitted to be exposed directly to the solvent for so long a time that the sponge fabric disintegrates. It has been found that for most conventional plastic sponges the applicator 16 will be effective to apply resist properly within less than one to five minutes after impregnation with resist, depending upon the particular solvent in the resist. Most sponge applicators, depending upon size, retain overall integrity for several hours after impregnation.

After the sponge applicator 16 has been impregnated with resist, and sufficient interaction between the resist and the applicator has taken place to permit holiday-free application, the sponge applicator is brushed lightly across the surface 14 in continuous strokes. After completing one stroke, another stroke is made with slight overlap of the first as illustrated in the figure. Sequential application is continued until all the desired portions of the surface 14 are covered with resist.

The solvent-softened resist-impregnated sponge applicator was found surprisingly effective in delivering a uniform holiday-free resist coat. The solvent in the photo resist causes the sponge applicator 16 to become extremely soft so that the sponge conforms to the surface 14 and adequately applies resist even to surface irregularities, small pits and scratches in the surface. The applicator 16 has been found convenient in applying photo resist to surfaces having unusual configurations such as curved surfaces, and inside surfaces. Moreover, extremely large objects which can be dipped or roller coated only with specialized equipment can be easily coated with the applicator 16.

After application of the surface 14 has been completed, the photo resist is preferably washed from the applicator to increase the life of the applicator. As mentioned above, if the photo resist is allowed to remain in the sponge for an extended length of time, depending upon the fabric of the sponge and the particular solvent in the resist, the sponge will disintegrate. If the sponge is washed after each use, it may be used several times before replacement is required.

The following non-limiting examples are representative of the method.

EXAMPLE 1

A plastic foam sponge was dipped into a pan of Eastman-Kodak resist identified as KPR-3. The sponge was found to become fully impregnated in several seconds. The impregnated sponge was then lightly drawn across a printed circuit laminate measuring 36 × 24 inches. The sponge delivered a coat of resist four inches wide across the laminate and, after completing one stroke, another stroke was made slightly overlapping the previously coated area. This sequence was repeated until the complete laminate was covered with resist. The slight overlap was found to equalize homogenously so that the resist coating was substantially uniform and remarkably holiday-free.

EXAMPLE 2

An instrument panel measuring 2 inches by 3 inches to be manufactured by the photo fabrication method was coated with resist by dipping a sponge into Dynachem resist 3154 and dragged lightly across the surface of the panel. A uniform highly desirable coating of resist resulted.

EXAMPLE 3

Cylinders having a four inch diameter were coated with resist so that an emblem could be photoengraved onto the exterior surface. A plastic foam sponge impregnated with Dynachem CMR 5000 was drawn lightly across the surface to be photoengraved. A uniform substantially holiday-free resist layer resulted.

EXAMPLE 4

Chemically milled screens from stainless steel were prepared by placing a first resist coat on one side of a stainless steel sheet as set forth in the foregoing example. After the resist had dried, the sheet was turned over and the other side coated in a like manner. Parts chemically machined from this double side resist coated stainless steel were uniform and of surprisingly high quality.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. In a method of distributing a photo polymer over a surface, the steps of absorbing liquid photo polymer into a plastic sponge; allowing solvent in the photo polymer to chemically react with and at least partially soften at least the exterior of the sponge; and drawing at least a portion of the photo polymer impregnated sponge across the surface.

2. A method as defined in claim 1 wherein said allowing step comprises contacting the solvent in the photo polymer with the sponge for a time increment which is long enough to effect slight dissolution of peripheral portions of the sponge but insufficient to cause the sponge to disintegrate.

3. A method of applying a photo polymer to a surface comprising the steps of:
obtaining a liquid photo polymer comprising a solvent;
obtaining a sponge applicator, the sponge comprising a synthetic open cellular material which is subject to slow dissolution by the solvent of the photo polymer;
absorbing the liquid photo polymer into the sponge applicator;
softening at least the exterior of the sponge with the solvent; and
applying the liquid photo polymer to the surface by drawing the sponge applicator across the surface before the solvent causes the sponge to substantially disintegrate.

* * * * *